(12) United States Patent
Rouaud

(10) Patent No.: US 10,421,092 B2
(45) Date of Patent: Sep. 24, 2019

(54) DYNAMIC SYNCHRONIZED ROBOTIC MASKING AND COATING SYSTEM

(71) Applicant: ABB Schweiz AG, Baden (CH)

(72) Inventor: Didier Rouaud, Bloomfield Hills, MI (US)

(73) Assignee: ABB Schweiz AG, Baden (CH)

( * ) Notice: Subject to any disclaimer, the term of this patent is extended or adjusted under 35 U.S.C. 154(b) by 2 days.

(21) Appl. No.: 15/366,647

(22) Filed: Dec. 1, 2016

(65) Prior Publication Data
US 2017/0080447 A1     Mar. 23, 2017

Related U.S. Application Data

(62) Division of application No. 14/266,854, filed on May 1, 2014, now Pat. No. 9,555,441.

(60) Provisional application No. 61/819,142, filed on May 3, 2013.

(51) Int. Cl.
| | | |
|---|---|---|
| B25J 15/00 | (2006.01) | |
| B05B 13/04 | (2006.01) | |
| B05B 12/12 | (2006.01) | |
| B05D 1/32 | (2006.01) | |
| B05D 1/36 | (2006.01) | |
| B05B 12/22 | (2018.01) | |
| B25J 11/00 | (2006.01) | |
| B05C 21/00 | (2006.01) | |
| B05B 12/20 | (2018.01) | |
| G03F 7/20 | (2006.01) | |

(52) U.S. Cl.
CPC ............ *B05B 12/22* (2018.02); *B05B 12/122* (2013.01); *B05B 12/20* (2018.02); *B05B 13/0431* (2013.01); *B05C 21/005* (2013.01); *B05D 1/32* (2013.01); *B05D 1/36* (2013.01); *B25J 11/0075* (2013.01); *B25J 15/0066* (2013.01); *G03F 7/70733* (2013.01); *G05B 2219/45013* (2013.01)

(58) Field of Classification Search
CPC ....... B05B 15/045; B05C 21/005; B05D 1/32; B25J 11/0075; G03F 7/70741; G03F 7/70733; C23C 14/042
See application file for complete search history.

(56) References Cited

U.S. PATENT DOCUMENTS

| | | | | |
|---|---|---|---|---|
| 3,504,063 A | * | 3/1970 | Lemelson ............ | B23K 15/002 264/245 |
| 3,619,311 A | * | 11/1971 | Rose ..................... | B05B 12/122 118/305 |
| 4,269,874 A | * | 5/1981 | Pryor ..................... | B05B 12/22 427/282 |

(Continued)

*Primary Examiner* — Karl Kurple
(74) *Attorney, Agent, or Firm* — Taft Stettinius & Hollister LLP; J. Bruce Schelkopf

(57) ABSTRACT

A computer-implemented system and method for operating mobile automated workstations in a workspace including a workpiece is disclosed. A computer device defines an exclusionary volume having an outer exclusionary surface at least partially surrounding a mobile workstation that is operably disposed in the workspace. The computer device receives data from at least one sensor and determines the location of the workstation and humans within the workspace based on the data. The computer device activates an indicator and alters the motion of the workstation after detection of a human breaching the exclusionary volume or exclusionary surface.

8 Claims, 5 Drawing Sheets

(56) References Cited

U.S. PATENT DOCUMENTS

| | | | | |
|---|---|---|---|---|
| 4,290,383 A | * | 9/1981 | Pfender | B05B 5/08 118/630 |
| 4,532,148 A | * | 7/1985 | Vecellio | B05B 5/04 118/323 |
| 4,641,780 A | * | 2/1987 | Smrt | B65D 83/203 239/150 |
| 4,662,310 A | * | 5/1987 | Faber | B05B 15/045 118/503 |
| 4,895,304 A | * | 1/1990 | Smrt | B65D 83/203 239/150 |
| 4,931,322 A | * | 6/1990 | Yamamoto | B05B 12/122 427/424 |
| 4,944,459 A | * | 7/1990 | Watanabe | B05B 12/1472 239/305 |
| 4,974,532 A | * | 12/1990 | March | B05B 12/22 118/301 |
| 5,098,024 A | * | 3/1992 | MacIntyre | B05B 13/0431 239/587.1 |
| 5,148,988 A | * | 9/1992 | Smrt | B65D 83/203 239/150 |
| 5,175,018 A | * | 12/1992 | Lee | B05B 13/0431 118/301 |
| 5,909,030 A | * | 6/1999 | Yoshitake | G03F 7/70358 250/492.2 |
| 5,940,674 A | * | 8/1999 | Sachs | B22F 3/115 264/414 |
| 6,414,744 B1 | * | 7/2002 | Kuiper | G03F 7/70741 355/75 |
| 6,451,117 B1 | * | 9/2002 | Farquhar | B05B 5/087 118/504 |
| 6,482,264 B1 | * | 11/2002 | Sun | B01J 19/0046 118/300 |
| 6,544,334 B1 | * | 4/2003 | Potyrailo | B01J 19/0046 118/300 |
| 6,756,074 B2 | * | 6/2004 | Potyrailo | B01J 19/0046 118/300 |
| 6,885,437 B2 | * | 4/2005 | Nishi | G03F 7/70733 355/53 |
| 7,279,045 B2 | * | 10/2007 | Strebe | B05B 12/08 118/325 |
| 8,770,247 B2 | * | 7/2014 | Oda | B25J 9/0084 156/351 |
| 9,522,412 B2 | * | 12/2016 | Rina | B05B 13/005 |
| 9,960,030 B2 | * | 5/2018 | Razek | H01L 21/02046 |
| 10,000,049 B2 | * | 6/2018 | DeFillipi | B32B 37/153 |
| 2001/0025603 A1 | * | 10/2001 | Ishigami | B05B 13/0242 118/320 |
| 2003/0077390 A1 | * | 4/2003 | Potyrailo | B01J 19/0046 506/40 |
| 2004/0028818 A1 | * | 2/2004 | Alexandrovich Potyrailo | B01J 19/0046 427/372.2 |
| 2004/0185172 A1 | * | 9/2004 | Liu | H01L 51/001 427/69 |
| 2006/0188594 A1 | * | 8/2006 | Strebe | B05B 12/08 425/71 |
| 2006/0292308 A1 | * | 12/2006 | Clifford | B05B 5/1633 427/427.2 |
| 2008/0017159 A1 | * | 1/2008 | Bohnheio | B05B 15/0431 123/193.2 |
| 2010/0316798 A1 | * | 12/2010 | Takahashi | B05B 13/0618 427/236 |
| 2012/0156362 A1 | * | 6/2012 | Sadovoy | B05B 12/084 427/9 |
| 2012/0199289 A1 | * | 8/2012 | Oda | B25J 9/0084 156/351 |
| 2013/0316543 A1 | * | 11/2013 | Altknecht | H01L 21/02636 438/761 |
| 2016/0083829 A1 | * | 3/2016 | Reid | C23C 4/02 427/448 |
| 2017/0069483 A1 | * | 3/2017 | Razek | C23C 14/022 |
| 2018/0099309 A1 | * | 4/2018 | De Filippi | B05B 12/16 |

\* cited by examiner

DYNAMIC SYNCHRONIZED ROBOTIC MASKING AND COATING SYSTEM

CROSS REFERENCE TO RELATED APPLICATIONS

The present application is a divisional of U.S. patent application Ser. No. 14/266,854, filed May 1, 2014, which claims the benefit of U.S. Provisional Application No. 61/819,142, filed May 3, 2013, the contents of each of these applications hereby incorporated by reference in its entirety.

FIELD OF INVENTION

The present disclosure concerns systems and methods for automatic masking and spray coating of workpieces. In particular, the present disclosure concerns coordinated, robotically controlled sprayed coating applicators and coating masks for applying coating such as paints to workpieces.

BACKGROUND

Automatic robotic control of paint sprayers and other forms of applicators has improved the precision and repeatability of the application of paints and other coating materials. Under certain circumstances, masking is required to achieve the desired coating of a workpiece. For example, masking can be required when only certain portions of a workpiece require coating. In another example, such masking can be required when multiple types of coating are applied over one but where portions of underlying coating remain exposed, or for example where coatings materials are applied to adjacent areas of a workpiece, delineated by a sharp line. Such masking can further be required on multiple duplicate workpieces, such as can be required during mass production of particular workpieces.

BRIEF DESCRIPTION OF THE DRAWINGS

In the accompanying drawings, structures and methods are illustrated that, together with the detailed description provided below, describe aspects of a system and method for dynamic synchronized coating and masking. It will be noted that a single component may be designed as multiple components or that multiple components may be designed as a single component.

Further, in the accompanying drawings and description that follow, like parts are indicated throughout the drawings and written description with the same reference numerals, respectively. The figures are not drawn to scale and the proportions of certain parts have been exaggerated for convenience of illustration.

DETAILED DESCRIPTION

Figure 1:
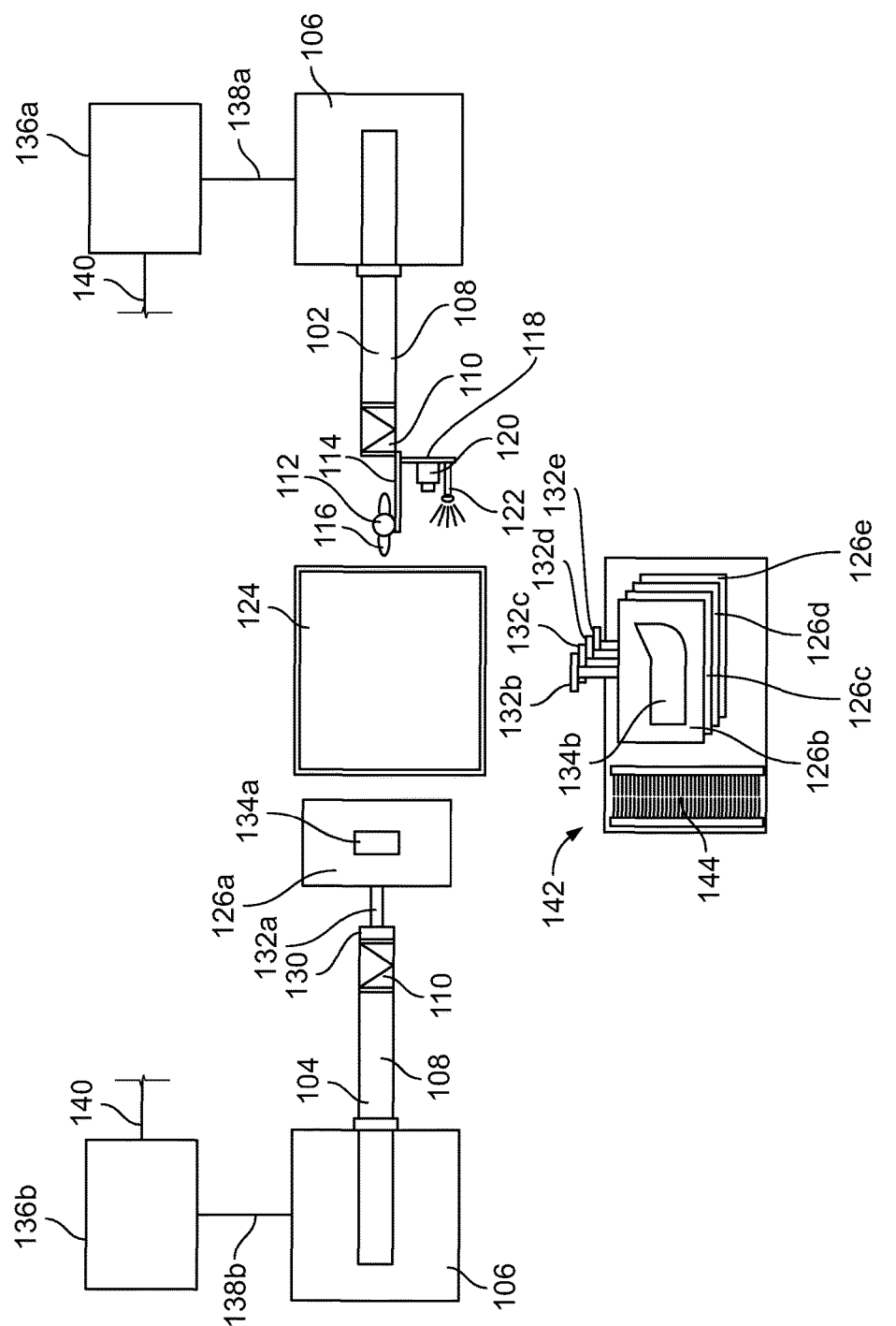
FIG. 1 illustrates an overhead schematic view of a coating system 100.

With reference to FIG. 1, a partial perspective view of a coating system 100 is shown according to one aspect of the present teachings. The coating system 100 includes coating applicator robot 102 and masking robot 104. Each of the coating applicator robot 102 and masking robot 104 has a base 106, an arm 108 and a wrist 110.

The coating applicator robot 102 and masking robot 104 are both articulated robots having 6 degrees of freedom. It should be noted that robots having less than or more than six degrees of freedom can be implemented according to the present teachings. Additional degrees of freedom, such as 7, 8, 9 or more, are possible by, for example, including additional joints with the robot. Fewer degrees of freedom can offer less flexibility relative to robots having 6 degrees of freedom. For example, a robot having 5 or 4 degrees of freedom can be implemented where 6 degrees of freedom are not required due to, for example, the shape of the workpiece not requiring complicated movement of one of the coating applicator robot 102 and masking robot 104. In addition to articulated robots 102, 104, other forms of programmable manipulators can also be implemented as one or both of robots 102, 104 according to the present teachings. Available manipulators include but are not limited to linear-type robots and delta-type robots.

The coating applicator robot 102 has a coating applicator 112 mounted to a coating applicator bracket 114 which is in turn secured to wrist 110 of coating applicator robot. The applicator 112 has a spray pattern 116 that is rotationally asymmetric about the direction of spraying and that having an elongated pattern. In other cases, the spray pattern 116 can be rotationally symmetric about the direction of spraying. The present teachings can also be implemented with applicators 112 having other different spray patterns 116.

The coating applicator robot 102 has a vision bracket 118 mounted to its wrist 110. The vision bracket 118 secures a camera 120 and a lamp 122 to the robot. The camera 120 can be used to locate detectable reference points on objects such as workpieces 124 or masks 126a-126e and thereby check the position of the applicator 112 relative to such objects. The lamp 122 improves visibility.

The masking robot 104 selectively mounts one of the masks 126a-126e found in magazine 128 by releasing any of the masks 126a-126e that may be held by the automatic tool changer 130, and then coupling the empty tool changer 130 to the bracket 132a-132e of one of the masks 126a-126e. Once coupled to the tool changer 130, the chosen mask 126a is secured to the masking robot 104 and can be manipulated such that the mask opening 134a can be selectively moved relative to the workpiece 124. It should be noted that the masks 126a-126e need not be limited to masks with holes such as the configurations of holes 134a and 134b, but also can include masks with outer edges that shield the workpiece 124 from coating.

Both the coating applicator robot 102 and the masking robot 104 are connected to a controller 136a, 136b through physical connections 138a, 138b. While physical connections are shown, wireless connections can also be implemented according to the present disclosure. The controllers 136a, 136b can include, for example, a central processing unit that executes computer-readable instructions stored on a non-transient medium and a power supply for the individual robots 102, 104. According to other aspects of the present teachings, the illustrated robots 102, 104 can be connected to a single controller that provides the functionality of the two individual controllers 136a, 136b illustrated in FIG. 1. According to still other aspects of the present teachings, one or more controllers 136a, 136b can be implemented with the robots 102, 104. In one example, one controller 136a, 136b can be connected to robots 102, 104.

According to yet other aspects of the present teachings, redundant controllers 136a, 136b can be connected to one or more of the robots 102, 104.

The controllers 136a, 136b can include, for example, a central processing unit ("CPU"), non-transient computer storage media such as random access memory ("RAM") and hard drive storage that can include one or more solid state and magnetic hard drives, for examples. The CPU can execute instructions stored on the non-transient computer storage media, such as one or both of the RAM and storage. The instructions written on one or both of the RAM and storage are written in a suitable computer-readable programming language such as the C programming language, or a programming language written for use with robots, such as the RAPID programming code made available by ABB, Inc. In addition, planning and programming of automated processes can be performed by use of software such as ROBOTSTUDIO® which permits loading of three-dimensional models of the workpiece (e.g., CAD representations of the workpiece), into ROBOTSTUDIO® and programming and simulating the robot processes within ROBOTSTUDIO®.

According to one aspect of the present teachings, upon execution of instructions stored on, for example, the RAM or storage by the CPU, the CPU provides signals to at least one of the robots 102, 104 that causes the respective robots 102, 104 to move and dispense coating as in the case of the coating applicator robot 102, or to move the mask 126a-126e secured to the masking robot 104. Instructions can be input into controllers 136a, 136b with an input/output device such as a keyboard, touchscreen, mouse, microphone or other device. Instructions can be input as, for example and not limited to, programming code or by inputting a travel path and speed of the applicator 112 or masks 126a-126e. The controllers 136a, 136b can also include instructions regarding selection, releasing and securing of masks 126a-126e and instructions regarding the flow rate of the coating, spray patterns or speed of movement of the respective robots 102, 104.

The controllers 136a, 136b can be connected to one another through connection 140, which can allow the controllers 136a, 136b to coordinate the movement of the respective robots 102, 104 during the coating process. The connection 140 can be an Ethernet connection, or other connection allowing communication between the controllers 136a, 136b. It should be noted that wireless connections can also be implemented instead of or in addition to physical connection 140. It should be noted that the aspects of controllers 136a, 136b described herein can be distributed, such as by providing computing resources and memory through one or more remote computer workstation, and providing a local interface such as a client computer interface or handheld device that communicates with the workstation through a communication connection such as a wireless connection or suitable cabling.

The magazine 128 includes a cleaning station 142 that includes brushes 144. The masks 126a-126e can be inserted into the station 142 after their use during a coating process according to the present teachings. The masks 126a-126e can be agitated within the station 142, which can contain a cleaning solvent, by the masking robot 104. Once cleaned, the masks 126a-126e can be returned to magazine 128.

Figure 2:
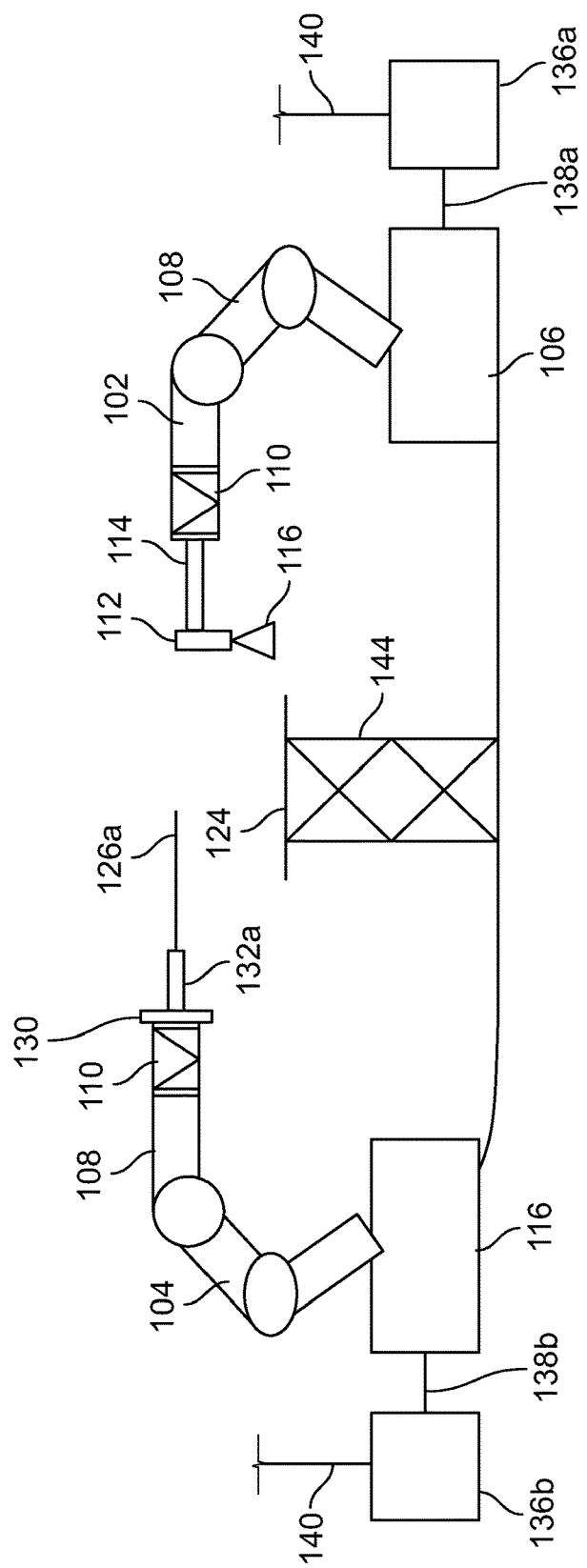
FIG. 2 illustrates an alternate partial schematic view of coating system 100.

While the illustrated workpiece is a piece of sheet metal, various structures can serve as workpieces 124. Examples of such structures include but are not limited to automotive vehicle components, aircraft wings and fuselages, windmill turbine blades, rockets, and large and small structures having complex 3-dimensional surfaces. With reference to FIG. 2, which omits mask magazine 128 for clarity, the workpiece is held stationary on rack 144. Other forms of mountings can be implemented according to the present disclosure. For example, a robot can hold workpiece 124 in position to apply coating. In another example, workpieces can be placed on a moving conveyor, which would require the robots 102, 104 to move in a manner consistent with the motion of the workpiece 124 on a conveyor. As can be seen in FIG. 2, the mask 126a is relatively thin, and according to one aspect of the present teachings is made of a rigid material such as plastic or metal such that the form of the holes such as holes 134a and 134b does not change due to flexing or deformation of the mask 126a-126e.

Various forms of coatings can be applied to workpieces 124 according to the present teachings, including primers and paints, for example automotive and industrial paints and primers. Other materials can be applied, such as liquid adhesives that require precise application. In another non-limiting example, liquid masking materials can be precisely applied according to the present teachings which can serve as a mask for other painting or coating processes to be performed subsequently.

Figure 3:
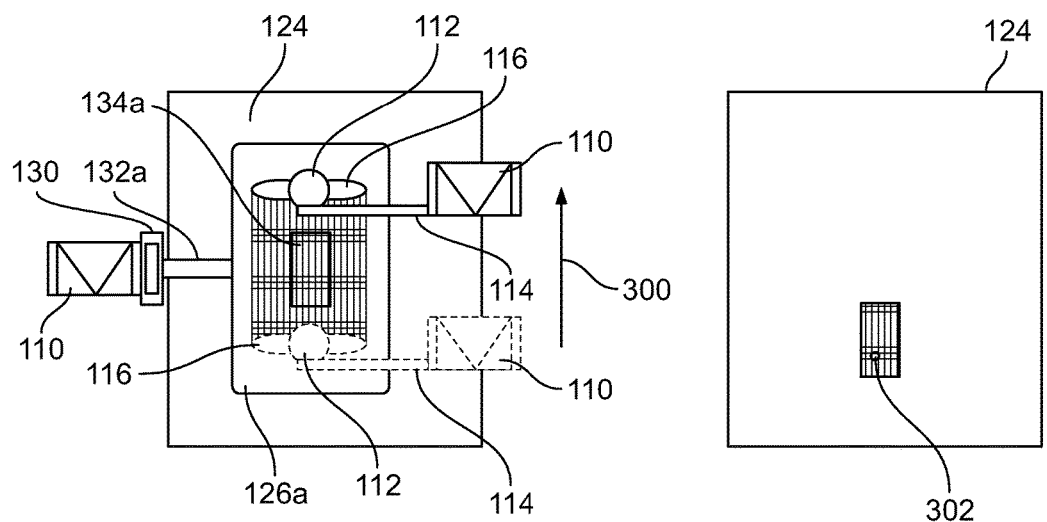
FIGS. 3-6 illustrate partial schematic views of coating system 100 and coated workpieces 124.

FIGS. 3 through 6 illustrate various example coordinated movements of the robots 102, 104 and the corresponding results of coating a workpiece according to the present teachings. In FIGS. 3 through 6, the robots' bases 106 and arms 108 are omitted for clarity. In FIG. 3, the mask 126a, which has a rectangular mask opening 134a, is held still relative to the workpiece while the applicator 112 is moved in direction 300 over the mask 134a. The resulting pattern 302 deposited on workpiece 124 is a rectangle matching the shape of the hole 134a.

Figure 4:
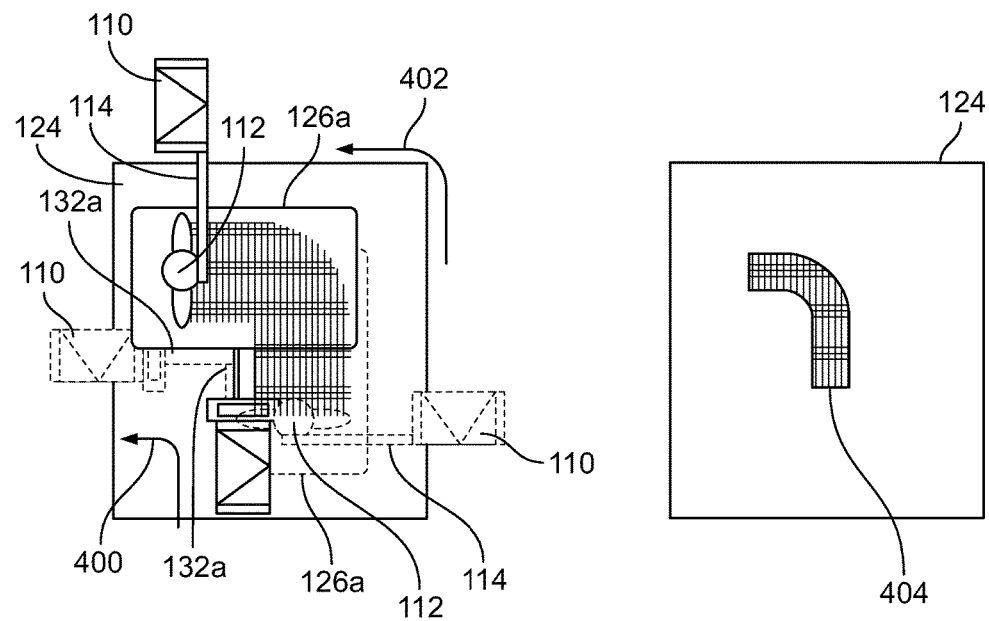

With reference to FIG. 4, the mask 126a and the applicator 112 are moved in a synchronized manner along similar paths involving translational and rotational motion of the mask 126a and applicator 112. The mask 126a is moved along L-shaped path 400 and the applicator 112 is moved along L-shaped path 402, resulting in an L-shaped pattern 404 of coating material deposited on workpiece 124. In this way, application of the present teachings can result in coating being deposited in a form having a different shape than the hole 134a in the mask 126a used in the coating process.

Figure 5:
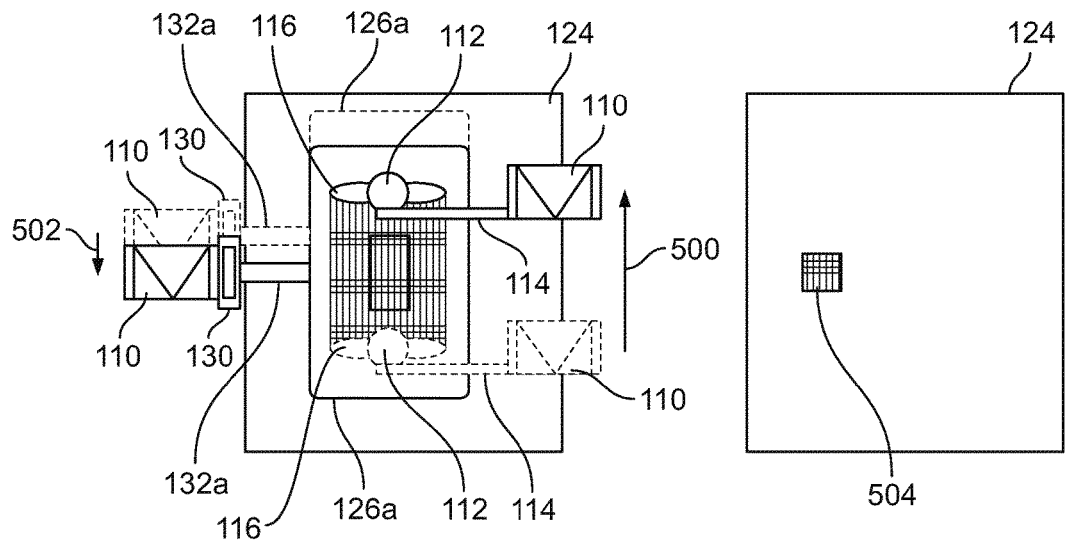
Figure 6:
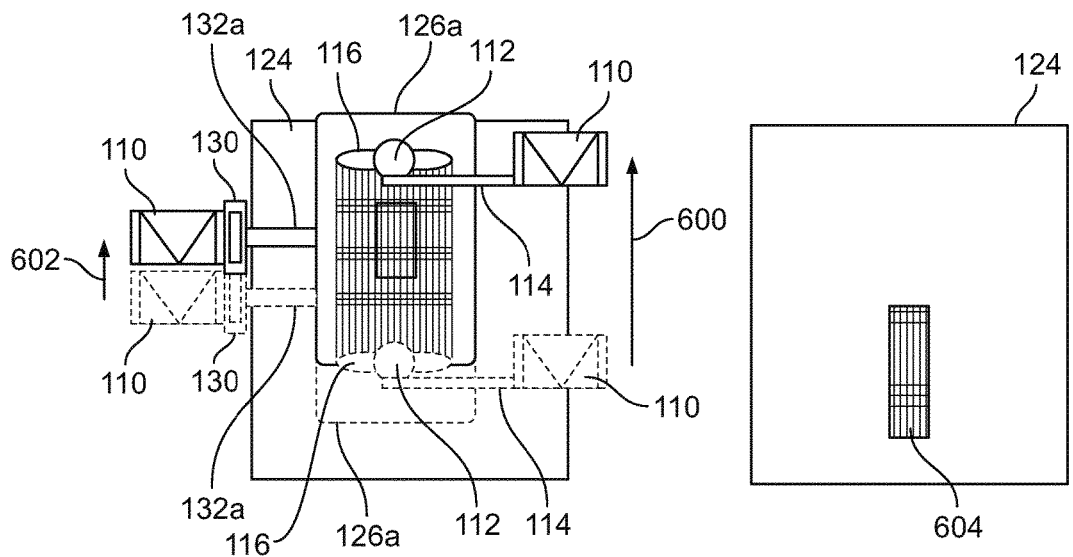

With reference to FIG. 5, the applicator 112 moves along a linear path 500 opposite in direction and greater in speed than the motion of the mask 126a along linear path 502. The resulting pattern 504 that is rectangular like hole 134a but having a set of shorter sides due to the opposite motion between path 500 and path 502. With reference to FIG. 6, the applicator 112 moves along linear path 600 with a greater speed than the mask 126a which travels along linear path 602 parallel to path 600. The resulting pattern 604 is a rectangular shape having a set of sides longer than that of hole 134a.

Figure 7:
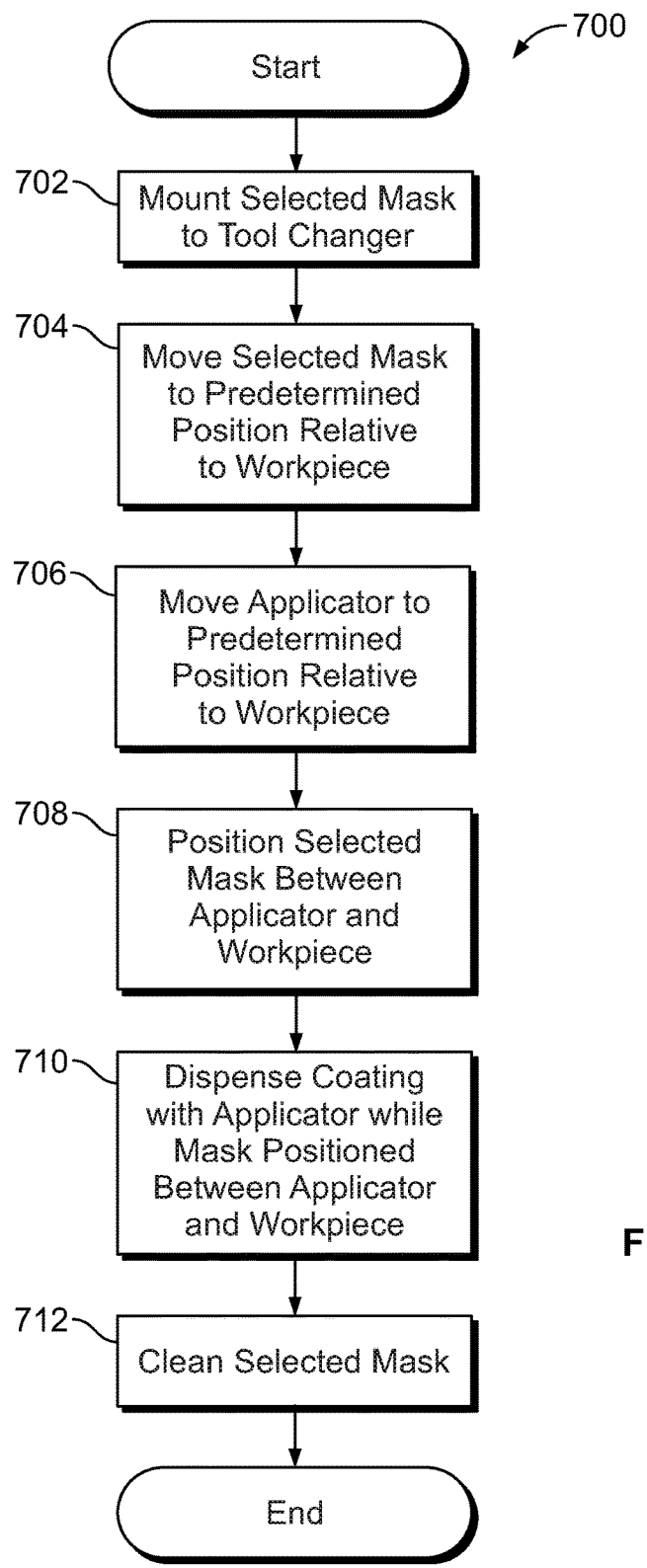
FIG. 7 illustrates steps of a method 700 of coating a workpiece 124.

With reference to FIG. 7, method 700 includes mounting a selected mask 126a-126e having a first configuration to a masking robot 104 in step 702. Step 702 can be preceded by unmounting any mask 126a-126e having a second configuration, or other end effector mounted to the tool changer 130. In step 704, the selected mask 126a-126e is moved to a predetermined position relative to the workpiece. In step 706, an applicator 112 is moved to a predetermined position relative to the workpiece. In step 708, the selected mask 126a-126e is positioned between the applicator 112 and the workpiece 124. In step 710, applicator 112 dispenses coating through or past the mask 126a-126e and onto the workpiece 124. It should be noted that the mask 126a-126e need not be limited to masks with holes, but also can include masks with outer edges that define where coating is intercepted by the mask 126a-126e.

During step 710, a portion of the coating material dispensed by applicator 112 will come into contact with the selected mask 126a-126e. Also during step 710, the selected mask 126a-126e can undertake coordinated movement with the applicator 112 wherein the selected mask 126a-126e remains positioned between the workpiece 124 and applicator 112 while one or both of the selected mask 126a-126e and applicator 112 undertake motion relative to the workpiece 124. Either one or both of applicator 112 or the selected mask 126a-126e can undertake coordinated motion relative to workpiece 124 during step 710. For example, the applicator 112 can remain motionless relative to the workpiece 124 while the selected mask 126a-126e undertakes motion relative to the workpiece 124 while remaining between the workpiece 124 and applicator. Conversely, applicator 112 can be in motion while the selected mask 126a-126e remains motionless. In another example, both the applicator 112 and selected mask 126a-126e undertake motion during step 710.

In step 712, the selected mask 126a-126e is cleaned. For example, the selected mask 126a-126e can be inserted into the cleaning station 142 at which point the mask 126a-126e is agitated to release any accumulated coating and then subsequently returned to the magazine 128. The steps of method 700 can be carried out with, for example, system 100 where instructions for executing the steps of method 700 are written on non-transient computer readable media on controllers 136a, 136b.

For the purposes of this disclosure and unless otherwise specified, "a" or "an" means "one or more." To the extent that the term "includes" or "including" is used in the specification or the claims, it is intended to be inclusive in a manner similar to the term "comprising" as that term is interpreted when employed as a transitional word in a claim. Furthermore, to the extent that the term "or" is employed (e.g., A or B) it is intended to mean "A or B or both." When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995). Also, to the extent that the terms "in" or "into" are used in the specification or the claims, it is intended to additionally mean "on" or "onto." As used herein, "about" will be understood by persons of ordinary skill in the art and will vary to some extent depending upon the context in which it is used. If there are uses of the term which are not clear to persons of ordinary skill in the art, given the context in which it is used, "about" will mean up to plus or minus 10% of the particular term. From about A to B is intended to mean from about A to about B, where A and B are the specified values.

While the present disclosure illustrates various embodiments, and while these embodiments have been described in some detail, it is not the intention of the applicant to restrict or in any way limit the scope of the claimed invention to such detail. Additional advantages and modifications will be apparent to those skilled in the art. Therefore, the invention, in its broader aspects, is not limited to the specific details and illustrative examples shown and described. Accordingly, departures may be made from such details without departing from the spirit or scope of the applicant's claimed invention. Moreover, the foregoing embodiments are illustrative, and no single feature or element is essential to all possible combinations that may be claimed in this or a later application.

The invention claimed is:

1. A coating system, comprising: a coating dispensing robot including an applicator; a masking robot; and a plurality of masks, the plurality of masks including a first mask having a first configuration, and a second mask having a second configuration, the first configuration being different than the second configuration; the coating dispensing robot and the masking robot in communication with at least one controller, the at least one controller including computer readable instructions written on a non-transient storage medium that upon execution: select, from the plurality of masks, the first mask for coupling to the masking robot; couple, by the masking robot and after selection of the first mask, the first mask to the masking robot; move, with the coat dispensing robot, the applicator relative to a workpiece to provide a movement of the applicator; move, with the masking robot, the first mask relative to the workpiece; position the first mask between the applicator and the workpiece; and, move, when the first mask is positioned between the applicator and the workpiece, the first mask relative to at least the applicator and the workpiece with the masking robot to provide a movement of the first mask; deposit, as the first mask is moved relative to at least the applicator and the workpiece, at least a portion of a coating dispensed by the applicator on the workpiece and at least another portion of the coating dispensed by the applicator on the first mask while the first mask is both coupled to the masking robot and positioned between the applicator and the workpiece; release, after the coating is deposited at least onto the workpiece, the first mask from being coupled to the masking robot; and couple, after the first mask is released, the second mask to the masking robot, and wherein the movement of the first mask is coordinated with the movement of the applicator such that, during dispensing of the coating by the applicator, the movement of the first mask is different with respect to (1) a speed, (2) a travel path, or (3) a direction of travel of the movement of the first mask from the movement of the applicator and the workpiece.

2. The coating system of claim 1, wherein the at least one controller is programmed to deposit at least a portion of coating dispensed by the applicator on the workpiece by dispensing the portion of coating through a hole in the first mask.

3. The coating system of claim 1, wherein the at least one controller is programmed to move the applicator relative to the workpiece while the first mask is moved by the masking robot relative to the workpiece and the applicator.

4. The coating system of claim 1, wherein the at least one controller is programmed to move the applicator by the movement of the coat dispensing robot in a linear direction that is opposite of a linear direction of the movement of the first mask by the movement of the masking robot while the applicator deposits at least the portion of the coating onto the workpiece.

5. The coating system of claim 1, wherein the at least one controller is programmed to move the applicator and the masking robot in the same direction while the coating applicator deposits at least a portion of the coating onto the workpiece.

6. The coating system of claim 1, wherein the coating system further a magazine sized to retain the plurality of masks, and wherein the at least one controller is programmed to locate the first mask within the magazine and remove the first mask from the magazine.

7. The coating system of claim 6, wherein the at least one controller is programmed to release the first mask into the magazine, locate the second mask within the magazine, and remove the second mask from the magazine.

8. The coating system of claim 1, wherein the at least one controller is programmed to provide the computer readable instructions to clean the at least another portion of the coating dispensed by the applicator on the first mask from the first mask or a coating on the second mask from the second mask.

\* \* \* \* \*